(12) United States Patent
Chen et al.

(10) Patent No.: US 11,521,939 B2
(45) Date of Patent: Dec. 6, 2022

(54) SEMICONDUCTOR DEVICE STRUCTURE HAVING STIFFENER WITH TWO OR MORE CONTACT POINTS FOR HEAT DISSIPATING ELEMENT

(71) Applicant: Advanced Semiconductor Engineering, Inc., Kaohsiung (TW)

(72) Inventors: Jui-Tzu Chen, Kaohsiung (TW); Yu-Hsing Lin, Kaohsiung (TW); Chia-Chieh Hu, Kaohsiung (TW); Chun-Cheng Kuo, Kaohsiung (TW); Yu-Hsiang Chao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/938,800

(22) Filed: Jul. 24, 2020

(65) Prior Publication Data
US 2022/0028800 A1    Jan. 27, 2022

(51) Int. Cl.
| | |
|---|---|
| H01L 23/00 | (2006.01) |
| H01L 23/367 | (2006.01) |
| H01L 23/16 | (2006.01) |
| H01L 21/48 | (2006.01) |

(52) U.S. Cl.
CPC ............ *H01L 23/562* (2013.01); *H01L 21/48* (2013.01); *H01L 23/16* (2013.01); *H01L 23/367* (2013.01)

(58) Field of Classification Search
CPC ....... H01L 23/562; H01L 21/48; H01L 23/16; H01L 23/367

USPC .......................................................... 257/717
See application file for complete search history.

(56) References Cited

U.S. PATENT DOCUMENTS

| | | | | |
|---|---|---|---|---|
| 5,297,006 | A * | 3/1994 | Mizukoshi | H01L 25/0652 257/713 |
| 7,687,823 | B2 * | 3/2010 | Amo | H01L 33/505 257/99 |
| 8,174,114 | B2 * | 5/2012 | Lee | H01L 24/28 257/713 |
| 8,269,418 | B2 * | 9/2012 | Kim | H05B 33/02 313/512 |
| 8,679,900 | B2 * | 3/2014 | Choi | H01L 23/36 438/122 |
| 9,089,051 | B2 * | 7/2015 | Li | H01L 25/0655 |
| 10,083,886 | B2 * | 9/2018 | Iruvanti | H01L 23/10 |
| 10,083,920 | B1 * | 9/2018 | Edwards | H01L 23/562 |
| 10,424,527 | B2 | 9/2019 | Sikka et al. | |
| 10,468,359 | B2 * | 11/2019 | Edwards | H01L 23/36 |
| 10,629,545 | B2 * | 4/2020 | Huang | H01L 23/04 |

(Continued)

*Primary Examiner* — Duy T Nguyen
(74) *Attorney, Agent, or Firm* — Foley & Lardner LLP

(57) ABSTRACT

Semiconductor device structures and methods for manufacturing the same are provided. The semiconductor device structure includes a substrate, a die and a stiffener. The substrate has an upper surface. The die is disposed on the upper surface of the substrate. The stiffener is disposed on the upper surface of the substrate and surrounds the die. The stiffener has a first upper surface adjacent to the die, a second upper surface far from the die and a lateral surface extending from the first upper surface to the second upper surface. A first distance between the first upper surface of the stiffener and the upper surface of the substrate is less than a second distance between the second upper surface of the stiffener and the upper surface of the substrate.

8 Claims, 15 Drawing Sheets

(56) References Cited

U.S. PATENT DOCUMENTS

| | | | | |
|---|---|---|---|---|
| 2005/0224953 A1* | 10/2005 | Lee | ................... | H01L 23/24 |
| | | | | 438/125 |
| 2007/0145571 A1* | 6/2007 | Lee | ................... | H01L 23/04 |
| | | | | 257/E23.101 |
| 2008/0149960 A1* | 6/2008 | Amo | ................... | H01L 33/486 |
| | | | | 257/98 |
| 2009/0127680 A1* | 5/2009 | Do | ................... | H01L 23/3135 |
| | | | | 257/675 |
| 2012/0057359 A1* | 3/2012 | Kim | ................... | H01L 33/62 |
| | | | | 362/382 |
| 2013/0154085 A1* | 6/2013 | Choi | ................... | H01L 23/36 |
| | | | | 257/720 |
| 2014/0151871 A1* | 6/2014 | Refai-Ahmed | ..... | H01L 23/3675 |
| | | | | 165/185 |
| 2014/0167243 A1* | 6/2014 | Shen | ................... | H01L 23/4334 |
| | | | | 257/692 |
| 2015/0001701 A1* | 1/2015 | Li | ................... | H01L 23/3737 |
| | | | | 257/713 |
| 2015/0340303 A1* | 11/2015 | Oh | ................... | H01L 25/071 |
| | | | | 438/109 |
| 2018/0068917 A1* | 3/2018 | Iruvanti | ................... | H01L 21/50 |
| 2018/0261554 A1* | 9/2018 | Huang | ................... | H01L 23/04 |
| 2019/0148260 A1* | 5/2019 | Sikka | ................... | H01L 23/3675 |
| | | | | 257/713 |
| 2019/0237411 A1* | 8/2019 | Edwards | ................... | H01L 23/36 |
| 2020/0312789 A1* | 10/2020 | Kim | ................... | H01L 23/16 |

* cited by examiner

SEMICONDUCTOR DEVICE STRUCTURE HAVING STIFFENER WITH TWO OR MORE CONTACT POINTS FOR HEAT DISSIPATING ELEMENT

BACKGROUND

1. Field of the Disclosure

The present disclosure relates to a semiconductor device structure, and in particular to a semiconductor device structure including a stiffener.

2. Description of the Related Art

As the technology of semiconductor device structures has progressed, heat dissipation has become increasingly important. A heat dissipating element is attached to a die through a thermal interface material (TIM) for increasing an area of heat dissipation. After multiple heating and cooling operations during manufacturing a semiconductor device structure, the substrate is liable to warp but the heat dissipating element is not, which makes the TIMs have different thickness at different positions. Thicker TIMs will degrade the performance of heat dissipation, and thus degrade the performance of the semiconductor device structure.

SUMMARY

In some embodiments, a semiconductor device structure includes a substrate, a die and a stiffener. The substrate has an upper surface. The die is disposed on the upper surface of the substrate. The stiffener is disposed on the upper surface of the substrate and surrounds the die. The stiffener has a first upper surface adjacent to the die, a second upper surface far from the die and a lateral surface extending from the first upper surface to the second upper surface. A first distance between the first upper surface of the stiffener and the upper surface of the substrate is less than a second distance between the second upper surface of the stiffener and the upper surface of the substrate.

In some embodiments, a semiconductor device structure includes a substrate, a stiffener and a heat dissipating element. The stiffener is disposed on the substrate. The stiffener has a first upper surface, a second upper surface and a lateral surface extending from the first upper surface to the second upper surface. The heat dissipating element is disposed on the stiffener. The heat dissipating element is disposed against the first upper surface and the second upper surface of the stiffener.

In some embodiments, a method for manufacturing a semiconductor device structure includes: providing a substrate; and disposing a stiffener on an upper surface of the substrate. The stiffener has a first upper surface, a second upper surface and a lateral surface extending from the first surface to the second surface. A first distance between the first upper surface of the stiffener and the upper surface of the substrate is less than a second distance between the second surface of the stiffener and the upper surface of the substrate.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
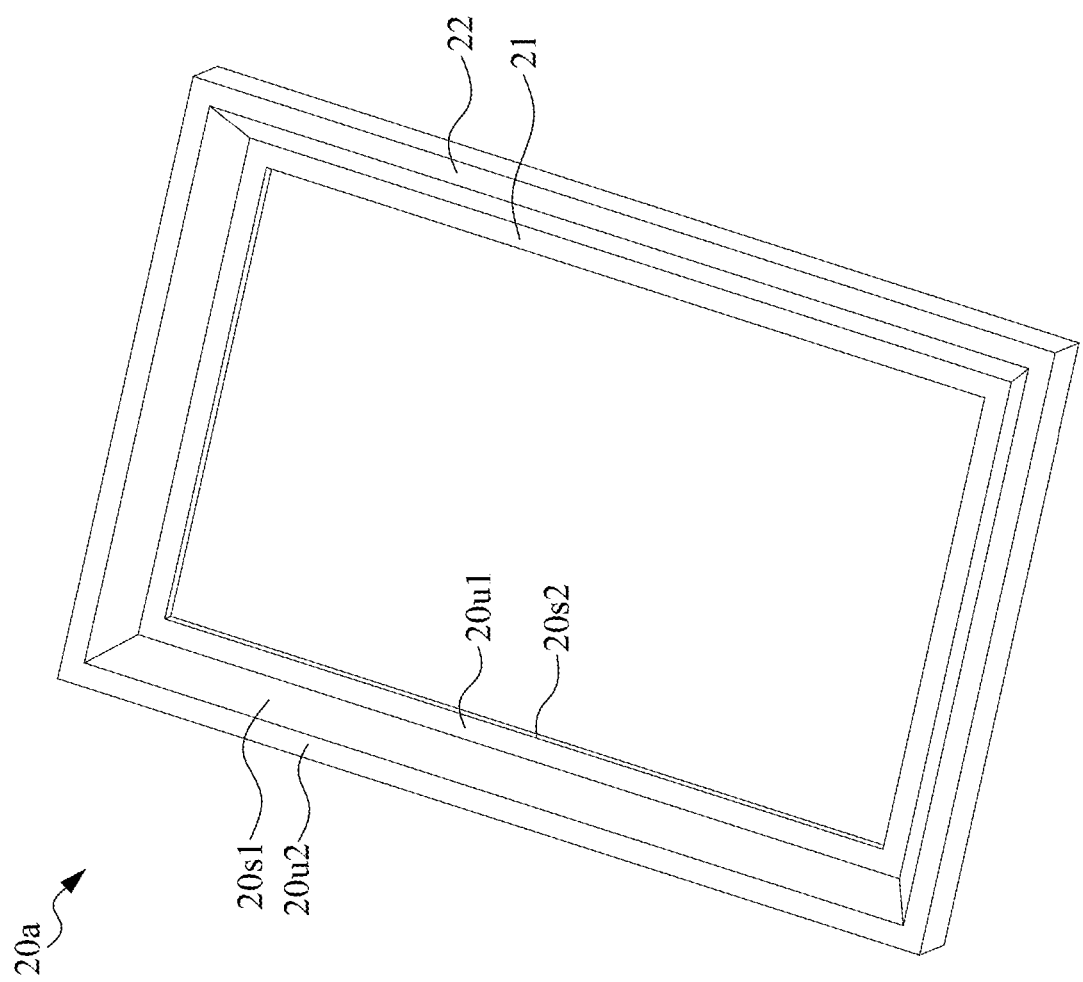
FIG. 1 illustrates a three-dimensional view of a stiffener according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a three-dimensional view of a stiffener 20a according to some embodiments of the present disclosure. The stiffener 20a may be configured to support a heat dissipating element. The stiffener 20a may also be configured to dissipate heat generated by an electronic component(s). The stiffener 20a may include thermal conductive material, such as metal, metal alloy or other suitable materials. In some embodiments, the stiffener 20a may have a ring shape from a top view. In some embodiments, the stiffener 20a may include a polygonal (e.g., triangular, rectangular, etc), circular or other suitable profile and has an opening in its center.

The stiffener 20a may have a first portion 21 and a second portion 22. In some embodiments, the first portion 21 may have a shape of a rectangle ring. The second portion 22 may be disposed on the first portion 21. In some embodiments, the second portion 22 and the first portion 21 may be formed in one-piece. That is, there is no boundary between the second portion 22 and the first portion 21. The stiffener 20a is monolithic. In some other embodiments, the second portion 22 and the first portion 21 may be formed separately. That is, there is a boundary between the first portion 21 and the second portion 22. In this embodiment, the second portion 22 may be attached to the first portion 21 by an adhesive.

In some embodiments, the stiffener 20a may include an upper surface 20u1, an upper surface 20u2, a lateral surface 20s1 and a lateral surface 20s2. The upper surface 20u2 may be located over the upper surface 20u1. The upper surface 20u2 may be substantially parallel to the upper surface 20u1. The lateral surface 20s1 may extend from the upper surface 20u2 to the upper surface 20u1. The lateral surface 20s2 may extend from the upper surface 20u1 to a lower surface opposing to the upper surface 20u1. In some embodiments, the lateral surface 20s1 may be oblique with respect to the upper surface 20u1 and/or the upper surface 20u2. The lateral surface 20s2 may be substantially perpendicular to the upper surface 20u1 and/or the upper surface 20u2.

Figure 2:
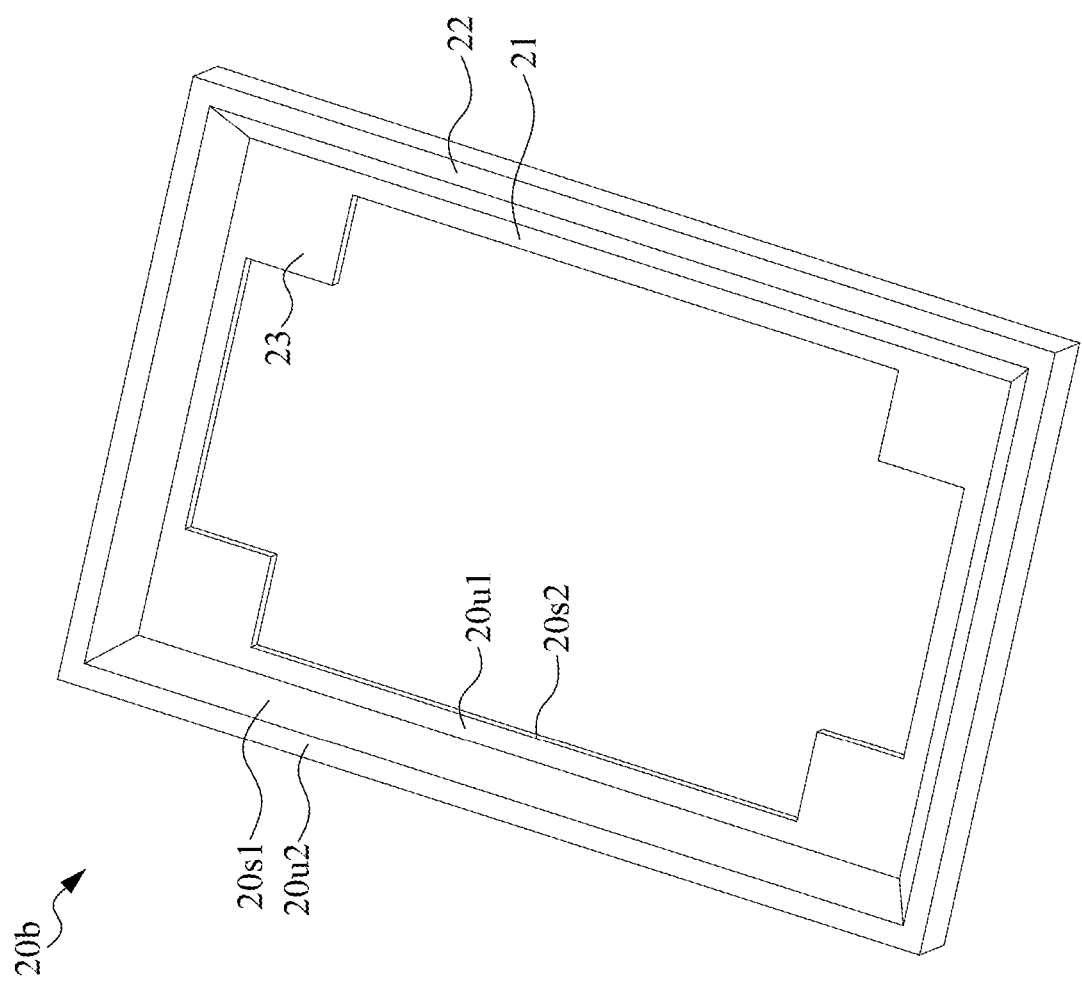
FIG. 2 illustrates a three-dimensional view of a stiffener according to some embodiments of the present disclosure.

FIG. 2 illustrates a three-dimensional view of a stiffener 20b according to some embodiments of the present disclosure. The stiffener 20b may have a structure that is the same as or similar to the stiffener 20a except that the stiffener 20b may further include a third portion 23.

In some embodiments, the third portion 23 may be located at a corner of the rectangle ring defined by the first portion 21. In some embodiments, the third portion 23 may extend laterally from the first portion 21. More specifically, the third portion 23 may extend from the lateral surface 20s2 of the stiffener 20b. In some embodiments, the third portion 23 may protrude inwardly from the lateral surface 20s2 of the stiffener 20b. Although FIG. 2 illustrates there are four third portions 23 located at four corners of the first portion 21, the number of third portions 23 may be modified. In other some embodiments, there are two third portions 23 located at two corners along a diagonal line of the rectangle ring defined by the first portion 21.

Figure 3:
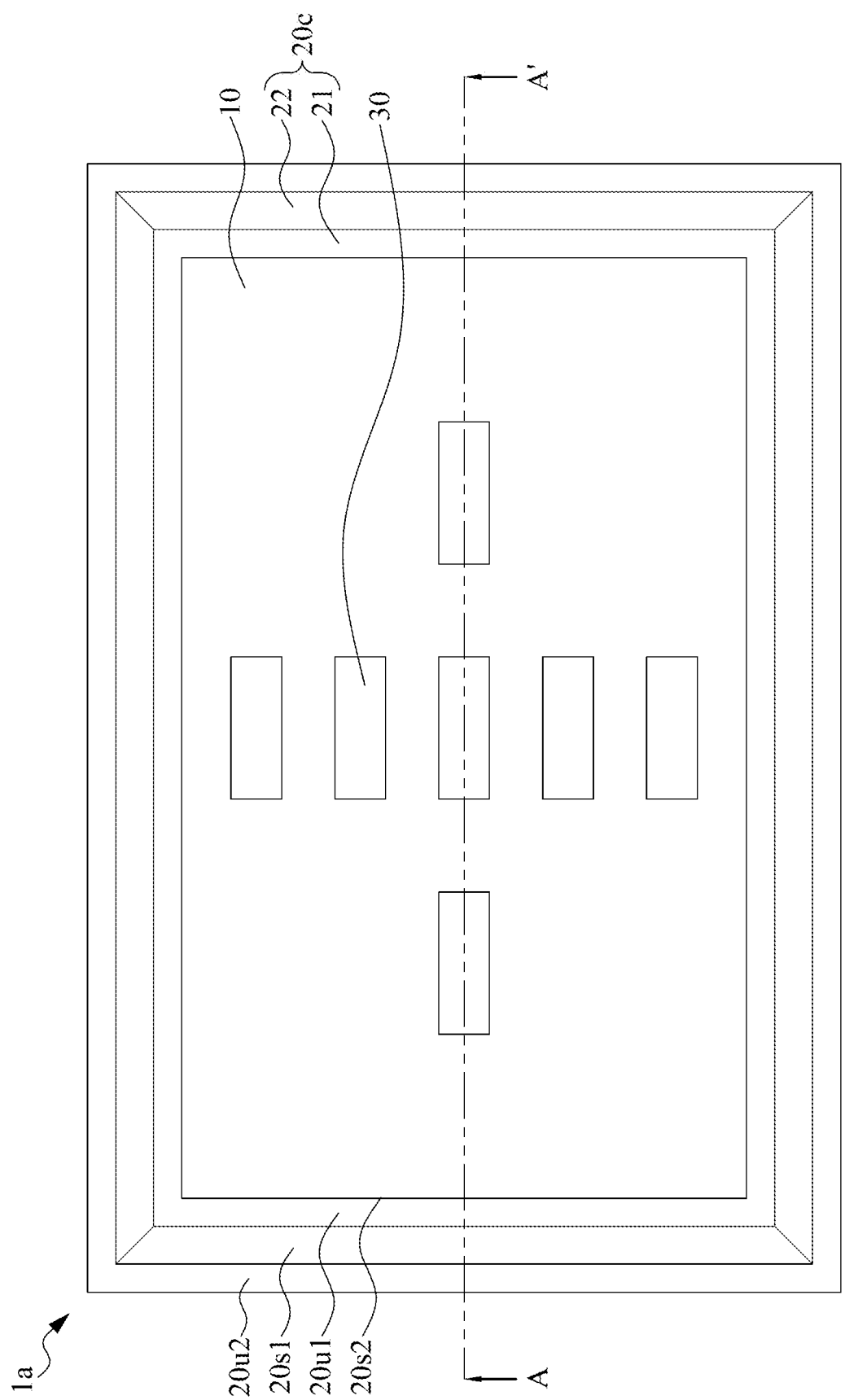
FIG. 3 illustrates a top view of a semiconductor device structure according to some embodiments of the present disclosure.

FIG. 3 illustrates a top view of a semiconductor device structure 1a according to some embodiments of the present disclosure. In some embodiments, the semiconductor device structure 1a may include a substrate 10, a stiffener 20c and an electronic component 30. The stiffener 20c may be disposed on the substrate 10. The electronic component 30 may be disposed on the substrate 10. The stiffener 20c may surround the electronic component 30.

Figure 4:
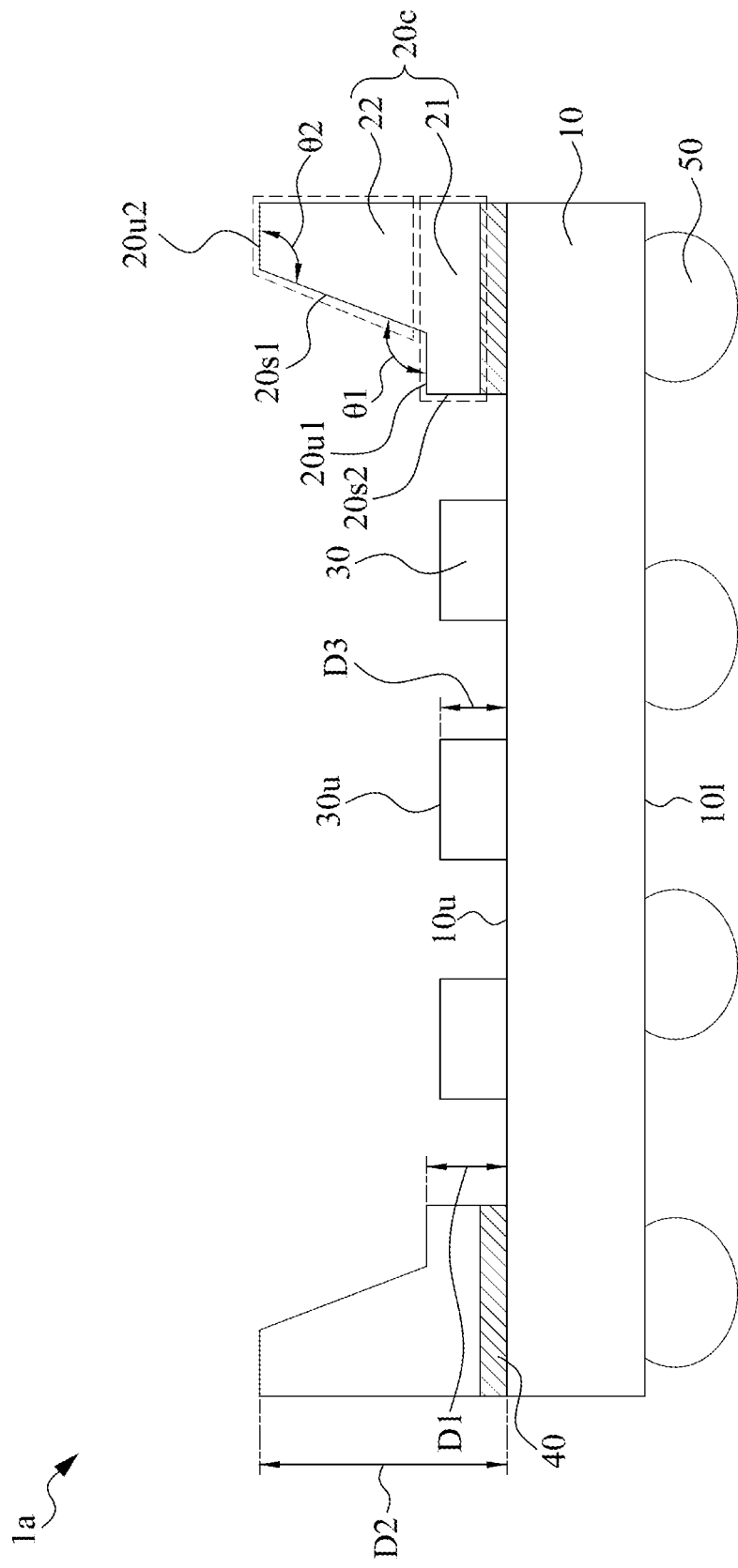
FIG. 4 illustrates a cross-sectional view of the semiconductor device structure along line A-A' of FIG. 3.

FIG. 4 illustrates a cross-sectional view of the semiconductor device structure 1a along line A-A'.

In some embodiments, the substrate 10 is formed of, for example, a printed circuit board (PCB), such as a paper-based copper foil laminate, a composite copper foil laminate, or a polymer-impregnated glass-fiber-based copper foil laminate. The substrate 10 may include redistribution layer(s) (RDL), trace(s), via(s) and/or pad(s), for electrical connection between components or between the upper surface and the lower surface of the substrate 10. In some embodiments, the substrate 10 can be replaced with other suitable carriers, such as a lead frame. The substrate 10 may have an upper surface 10u on which the stiffener 20c is disposed.

The stiffener 20c may have a structure that is the same as or similar to that of the stiffener 20a. In some embodiments, the stiffener 20c and the substrate 10 may define a space for accommodating one or more electronic components 30. The first portion 21 may be disposed on the substrate 10. In some embodiments, the first portion 21 is non-tapered. In some embodiments, the second portion 22 is tapered. More specifically, the second portion 22 may be tapered far from the substrate 10. The second portion 22 may be tapered toward the upper surface 20u2. In some embodiments, the lateral surface 20s1 and the upper surface 20u2 may be defined by the second portion 22. The upper surface 20u1 and the lateral surface 20s2 may be defined by the first portion 21. More specifically, the upper surface 20u1 may be defined as a surface of the first portion 21 that is exposed from the second portion 22. In some embodiments, the upper surface 20u1 may extend from the lateral surface 20s1 toward the electronic component 30. The upper surface 20u1 is adjacent to the electronic component 30, and the upper surface 20u2 is far from the electronic component 30. There is a distance D1 between the upper surface 20u1 of the stiffener 20c and the upper surface 10u of the substrate 10. There is a distance D2 between the upper surface 20u2 of the stiffener 20c and the upper surface 10u of the substrate 10. In some embodiments, the distance D1 is less the distance D2.

In some embodiments, the angle θ1 constituted by the upper surface 20u1 and the lateral surface 20s1 ranges from about 90° to about 115° and can be, for example, 90°, 92°, 95°, 100°, 105°, 100° or 115°. In some embodiments, the angle θ2 constituted by the upper surface 20u2 and the lateral surface 20s1 ranges from about 90° to about 115° and can be, for example, 90°, 92°, 95°, 100°, 105°, 100° or 115°.

The electronic component 30 may be disposed on the upper surface 10u of the substrate 10. The electronic component 30 may be disposed in a space defined by the substrate 10 and the stiffener 20c. The electronic component 30 may include one or more semiconductor dies in the form of one or more integrated circuits (ICs) (such as packaged semiconductor dies). In some embodiments, the electronic component 30 may include, but is not limited to, at least one active component such as MEMS die or another active component. In some embodiments, the electronic component 30 may include, but is not limited to, at least one passive component such as a capacitor, a resistor, or another passive component.

The electronic component 30 may have an upper surface 30u. There is a distance D3 between the upper surface 30u of the electronic component 30 and the upper surface 10u of the substrate 10. In some embodiments, the distance D1 is greater than the distance D3.

The adhesive 40 may be disposed on the upper surface 10u of the substrate 10. In some embodiments, the stiffener 20c may be attached to the substrate 10 by the adhesive 40.

The bump 50 may be disposed on a lower surface 10l of the substrate 10. The bump 50 may be a solder ball (e.g., Sn ball). The bump 50 may be electrically connected to the electronic component 30 though RDL and/or trace(s) in the substrate 10.

Figure 5:
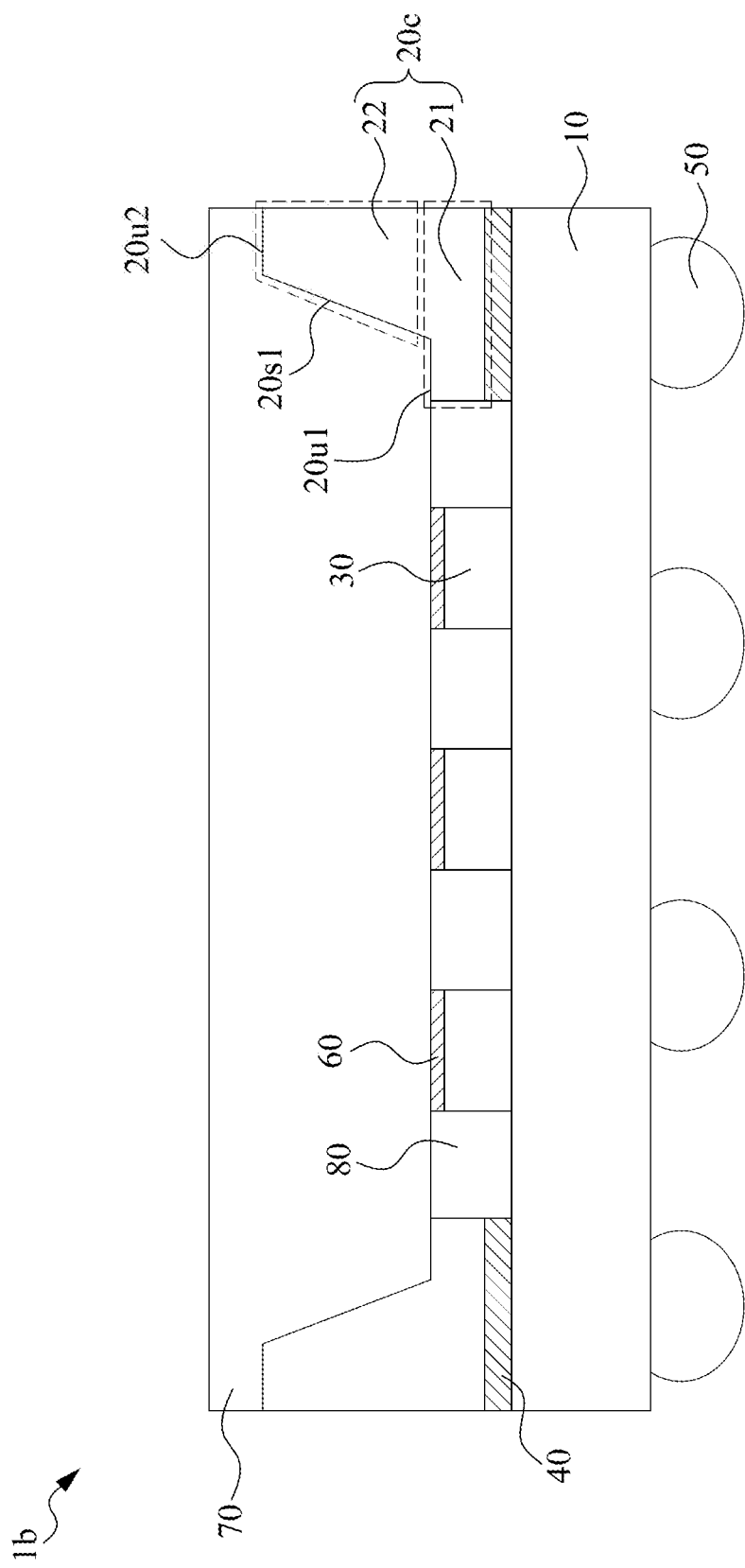
FIG. 5 illustrates a cross-sectional view of a semiconductor device structure according to some embodiments of the present disclosure.

FIG. 5 illustrates a cross-sectional view of a semiconductor device structure 1b according to some embodiments of the present disclosure. The semiconductor device structure 1b may have a structure similar to or the same as that of the semiconductor device structure 1a of FIG. 4 except that the semiconductor device structure 1b further includes a thermal interface material (TIM) 60 and a heat dissipating element 70.

The TIM 60 may be disposed on the electronic component 30. The TIM 60 may be disposed between the electronic component 30 and the heat dissipating element 70. The TIM 60 may be in contact with an upper surface of the electronic component 30 and a lower surface of the heat dissipating element 70. The TIM 60 may be configured to conduct heat, generated from the electronic component 30, to the heat dissipating element 70, thereby decreasing thermal resistance and thus allowing semiconductor device structure 1b to achieve better performance.

The heat dissipating element 70 may be disposed on the stiffener 20c. The heat dissipating element 70 may be configured to dissipate heat generated from the electronic component 30. The heat dissipating element 70 may include a thermal conductive material, such as metal, metal alloy or other suitable material. In some embodiments, the heat dissipating element 70 may be in contact with the upper surface 20u1, the lateral surface 20s1 and the upper surface 20u2 of the stiffener 20c. In some embodiments, the heat dissipating element 70 may be disposed against the upper surface 20u1, the upper surface 20u2 and the lateral surface 20s1 of the stiffener 20c. That is, the weight of the heat dissipating element 70 may be borne by the upper surface 20u1, the upper surface 20u2 and the lateral surface 20s1 of the stiffener 20c. More specifically, the heat dissipating element 70 may be supported by the upper surface 20u1, the upper surface 20u2 and the lateral surface 20s1 of the stiffener 20c.

In some embodiments, the semiconductor device structure 1b may further include a filler 80. The filler 80 may be disposed on the substrate 10. The filler 80 may be filled into a space defined by the substrate 10, the stiffener 20c, the electronic component 30 and the heat dissipating element 70. In some embodiments, the filler 80 may be a polymeric material. In some embodiments, the filler 80 is non-conductive polymeric material.

In this embodiment, the heat dissipating element 70 may be disposed against three surfaces of the stiffener 20c. The stiffener 20c may provide more contact points for heat dissipating element 70 and the contact surface between the stiffener 20c and the heat dissipating element 70 is thus increased. Therefore, the heat dissipating element 70 may impose more pressure on the stiffener 20c which may enhance the adhesion between the stiffener 20c and the substrate 10, thereby reducing warpage of the substrate 10 and preventing from the separation of the stiffener 20c and the substrate 10 due to the warpage of the substrate 10. In a comparative semiconductor device structure, the heat dissipating element is disposed against the stiffener by one surface or point, which makes the substrate liable to warp or separate from the stiffener. In comparison with the comparative semiconductor device structure, the warpage of the substrate 10 of the semiconductor device structure 1a may be reduced from about 350 µm to about 200 µm. Therefore, the TIMs 60 may have a relatively uniform thickness even if they are located at different position, such as at a central portion of the semiconductor device structure or at a peripheral portion of the semiconductor device structure. As a result, the performance of the semiconductor device structure 1a may be improved.

Figure 6:
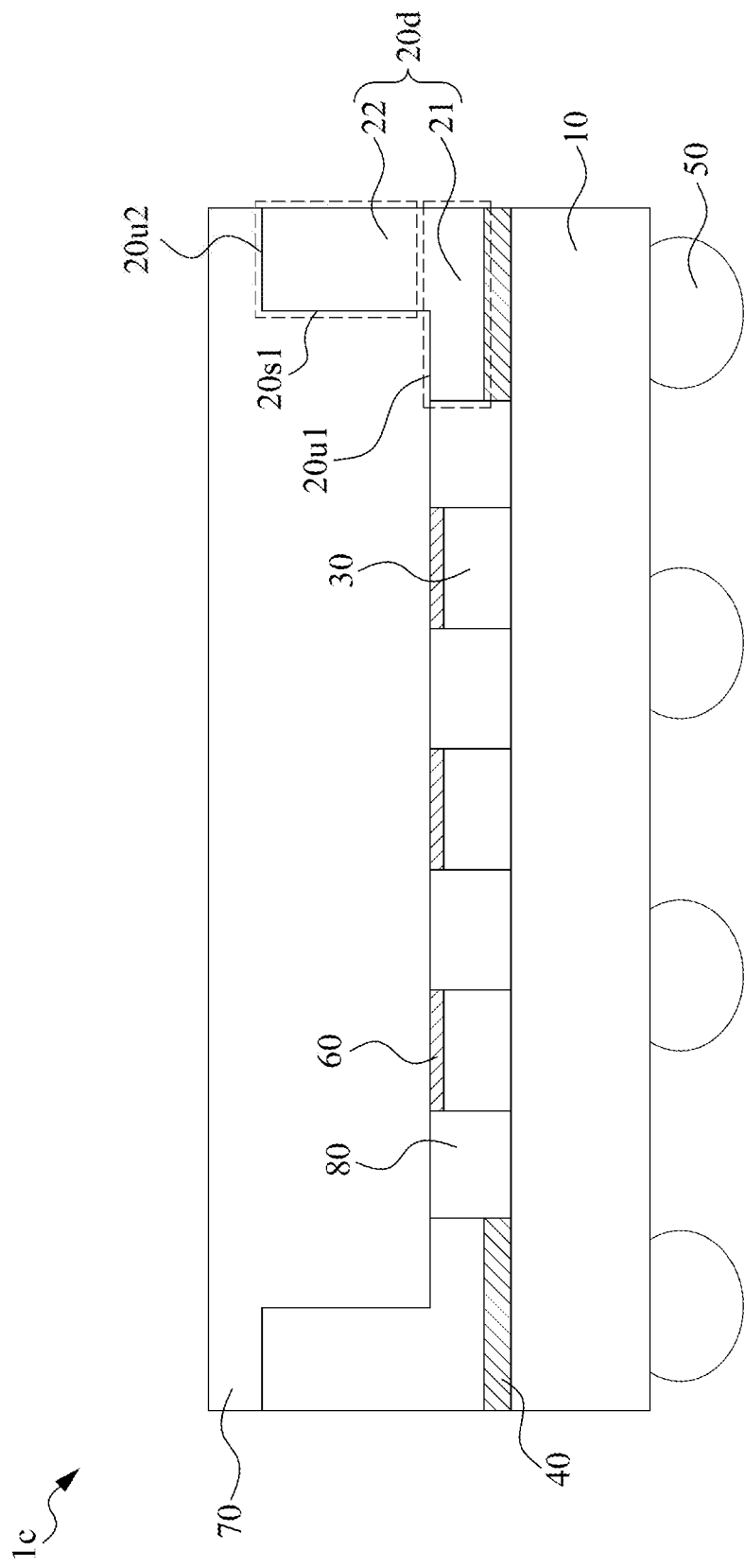
FIG. 6 illustrates a cross-sectional view of a semiconductor device structure according to some embodiments of the present disclosure.

FIG. 6 illustrates a cross-sectional view of a semiconductor device structure 1c according to some embodiments of the present disclosure. The semiconductor device structure 1c may have a structure similar to or the same as that of the semiconductor device structure 1b of FIG. 5 except that the semiconductor device structure 1c includes a stiffener 20d replacing the stiffener 20c.

In some embodiments, the second portion 22 is non-tapered. That is, the lateral surface 20s1 may be substantially perpendicular to the upper surface 20u2 and/or the upper surface 20u1. In this embodiment, the heat dissipating element 70 is disposed against the upper surface 20u1 and the upper surface 20u2 of the stiffener 20d. That is, the heat dissipating element 70 is supported by the upper surface 20u1 and the upper surface 20u2 of the heat dissipating element 70. The weight of the heat dissipating element 70 may be borne by the upper surface 20u1 and the upper surface 20u2 of the stiffener 20d. More specifically, the heat dissipating element 70 may be supported by the upper surface 20u1 and the upper surface 20u2 of the stiffener 20d.

Similar to the semiconductor device structure 1b illustrated in FIG. 5, in the semiconductor device structure 1c as illustrated in FIG. 6, the heat dissipating element 70 may be disposed against at least two surfaces of the stiffener 20d. The stiffener 20d may provide more contact points for heat dissipating element 70 and the contact surface between the stiffener 20d and the heat dissipating element 70 is thus increased. Therefore, the heat dissipating element 70 may impose more pressure on the stiffener 20d which may enhance the adhesion between the stiffener 20d and the substrate 10, thereby reducing warpage of the substrate 10 and preventing from the separation of the stiffener 20d and the substrate 10 due to the warpage of the substrate 10. The TIMs 60 may have a relatively uniform thickness even if they are located at different position, such as at a central portion of the semiconductor device structure or at a peripheral portion of the semiconductor device structure. As a result, the performance of the semiconductor device structure 1c may be improved.

Figure 7:
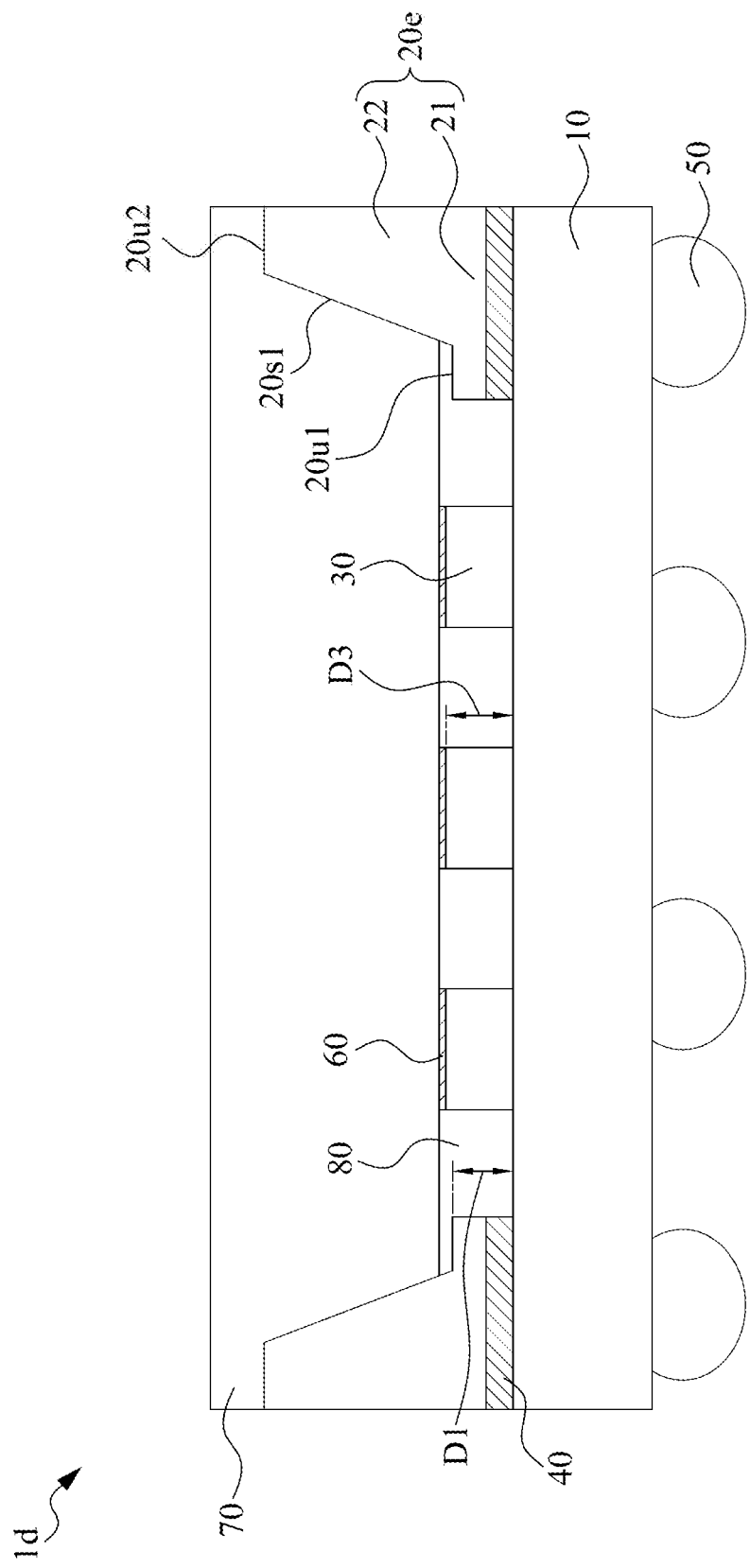
FIG. 7 illustrates a cross-sectional view of a semiconductor device structure according to some embodiments of the present disclosure.

FIG. 7 illustrates a cross-sectional view of a semiconductor device structure 1d according to some embodiments of the present disclosure. The semiconductor device structure 1d may have a structure similar to or the same as that of the semiconductor device structure 1b of FIG. 5 except that the semiconductor device structure 1d includes a stiffener 20e replacing the stiffener 20c.

In some embodiments, the heat dissipating element 70 may be disposed against the upper surface 20u2 and the lateral surface 20s1 of the stiffener 20e. That is, the weight of the heat dissipating element 70 may be borne by the upper surface 20u2 and the lateral surface 20s1 of the stiffener 20e. More specifically, the heat dissipating element 70 may be supported by the upper surface 20u2 and the lateral surface 20s1 of the stiffener 20e.

Similar to the semiconductor device structure 1b illustrated in FIG. 5, in the semiconductor device structure 1d as illustrated in FIG. 7, the heat dissipating element 70 may be disposed against at least two surfaces of the stiffener 20e.

The stiffener 20e may provide more contact points for heat dissipating element 70 and the contact surface between the stiffener 20e and the heat dissipating element 70 is thus increased. Therefore, the heat dissipating element 70 may impose more pressure on the stiffener 20e which may enhance the adhesion between the stiffener 20e and the substrate 10, thereby reducing warpage of the substrate 10 and preventing from the separation of the stiffener 20e and the substrate 10 due to the warpage of the substrate 10. The TIMs 60 may have a relatively uniform thickness even if they are located at different position, such as at a central portion of the semiconductor device structure or at a peripheral portion of the semiconductor device structure. As a result, the performance of the semiconductor device structure 1d may be improved.

In some embodiments, the upper surface 20u1 of the stiffener 20e is not in contact with the heat dissipating element 70. The heat dissipating element 70 is spaced from the upper surface 20u1 of the stiffener 20e. In some embodiments, an adhesive may be disposed on the upper surface 20u1 of the stiffener 20e and in contact with the heat dissipating element 70. In some other embodiments, a filler may be disposed on the upper surface 20u1 of the stiffener 20e and in contact with the heat dissipating element 70. The heat dissipating element 70 may put weight on the stiffener 20e through the additive or the filler. In some embodiments, the distance D1 is less than or equal to the distance D3. In this embodiment, the TIM 60 of the semiconductor device structure 1d may be thinner, thereby further reducing thermal resistance of the semiconductor device structure 1d.

Figure 8:
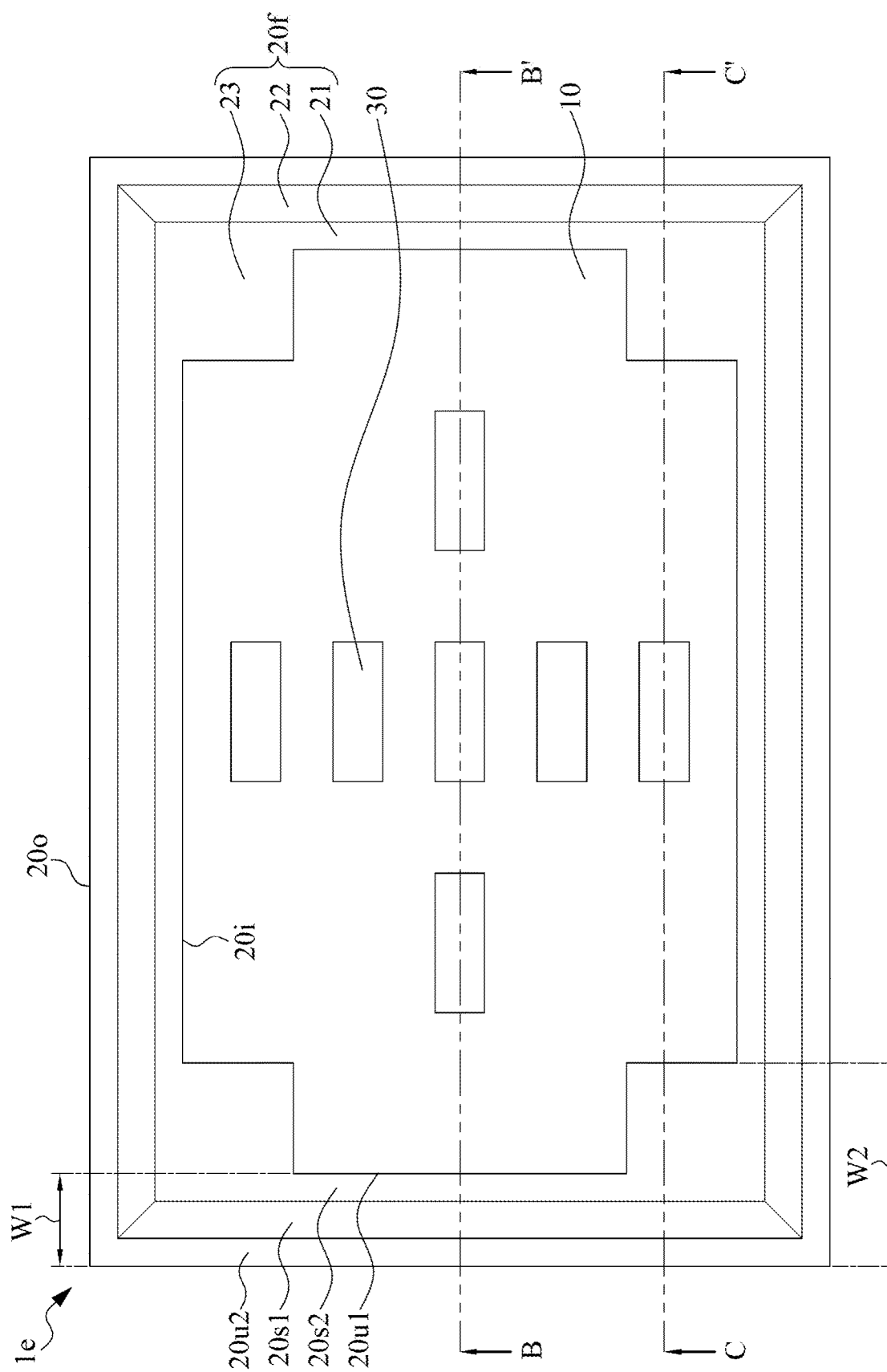
FIG. 8 illustrates a top view of a semiconductor device structure according to some embodiments of the present disclosure.

FIG. 8 illustrates a top view of a semiconductor device structure 1e according to some embodiments of the present disclosure. The semiconductor device structure 1e may have a structure similar to or the same as that of the semiconductor device structure 1a of FIG. 3 except that the semiconductor device structure 1e includes a stiffener 20f replacing the stiffener 20c.

The stiffener 20f may have a structure similar to or the same as that of the stiffener 20c. The stiffener 20f may include the third portion 23 that extends from the first portion 21 inwardly toward the electronic component 30. The stiffener 20f may have an inner surface 20i and an outer surface 20o. The outer surface 20o may surround the inner surface 20i. There is a length W1 between the outer surface 20o and the inner surface 20i corresponding to a region where the third portion 23 is not formed. There is a length W2 between the outer surface 20o and the inner surface 20i corresponding to a region where the third portion 23 is formed. In some embodiments, the length W1 is different from the length W2. In some embodiments, the length W1 is less than the length W2.

Figure 9:
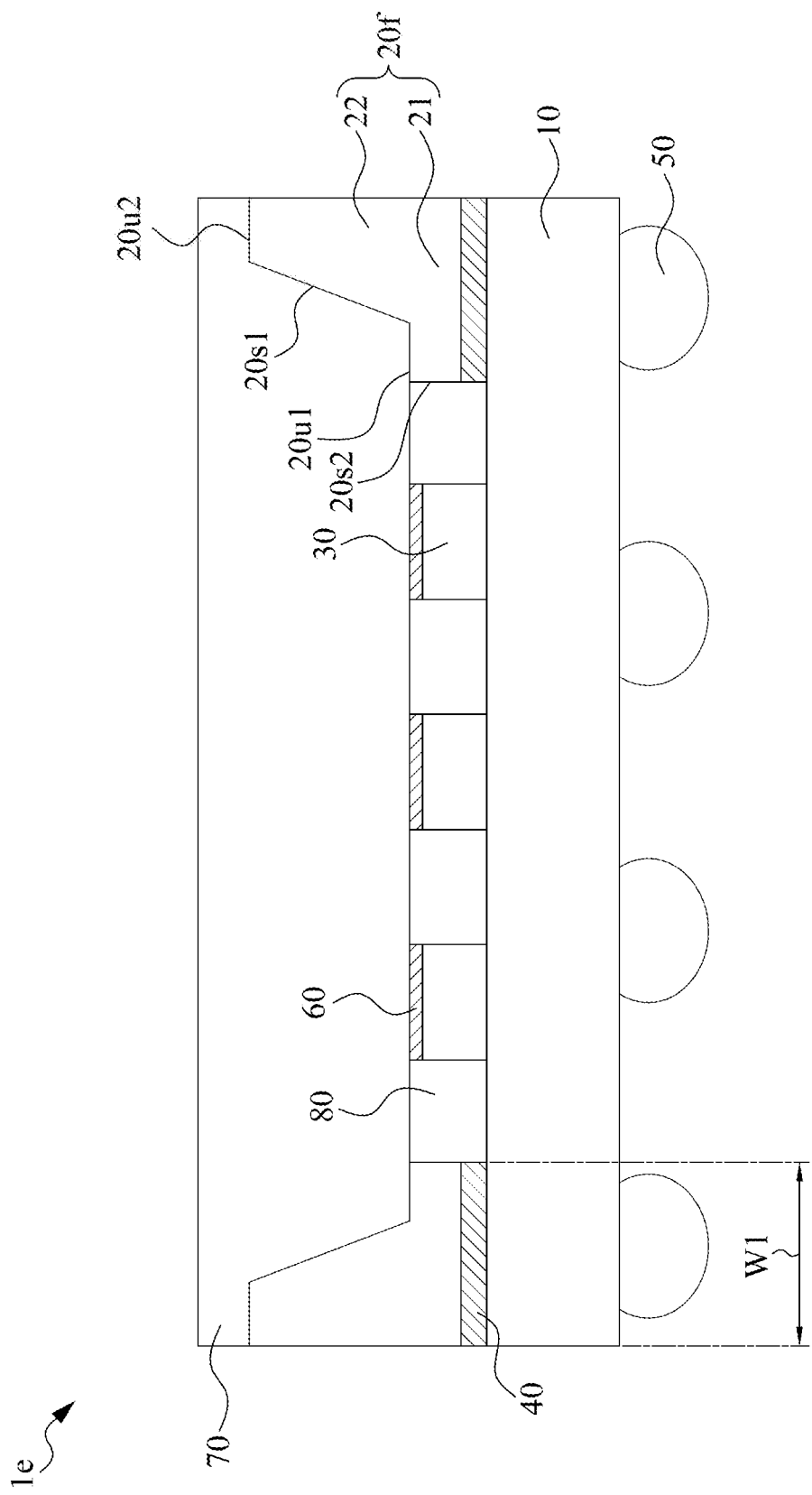
FIG. 9 illustrates a cross-sectional view of the semiconductor device structure along line B-B' of FIG. 8.

FIG. 9 illustrates a cross-sectional view of the semiconductor device structure 1e along line B-B'. In this cross-section, the semiconductor device structure 1e may have the same structure as that of the semiconductor device structure 1b depicted in FIG. 5. The stiffener 20f may have the length W1 between two lateral surfaces of the stiffener 20f. The length W1 may be measured along a lower surface of the stiffener 20f.

Figure 10:
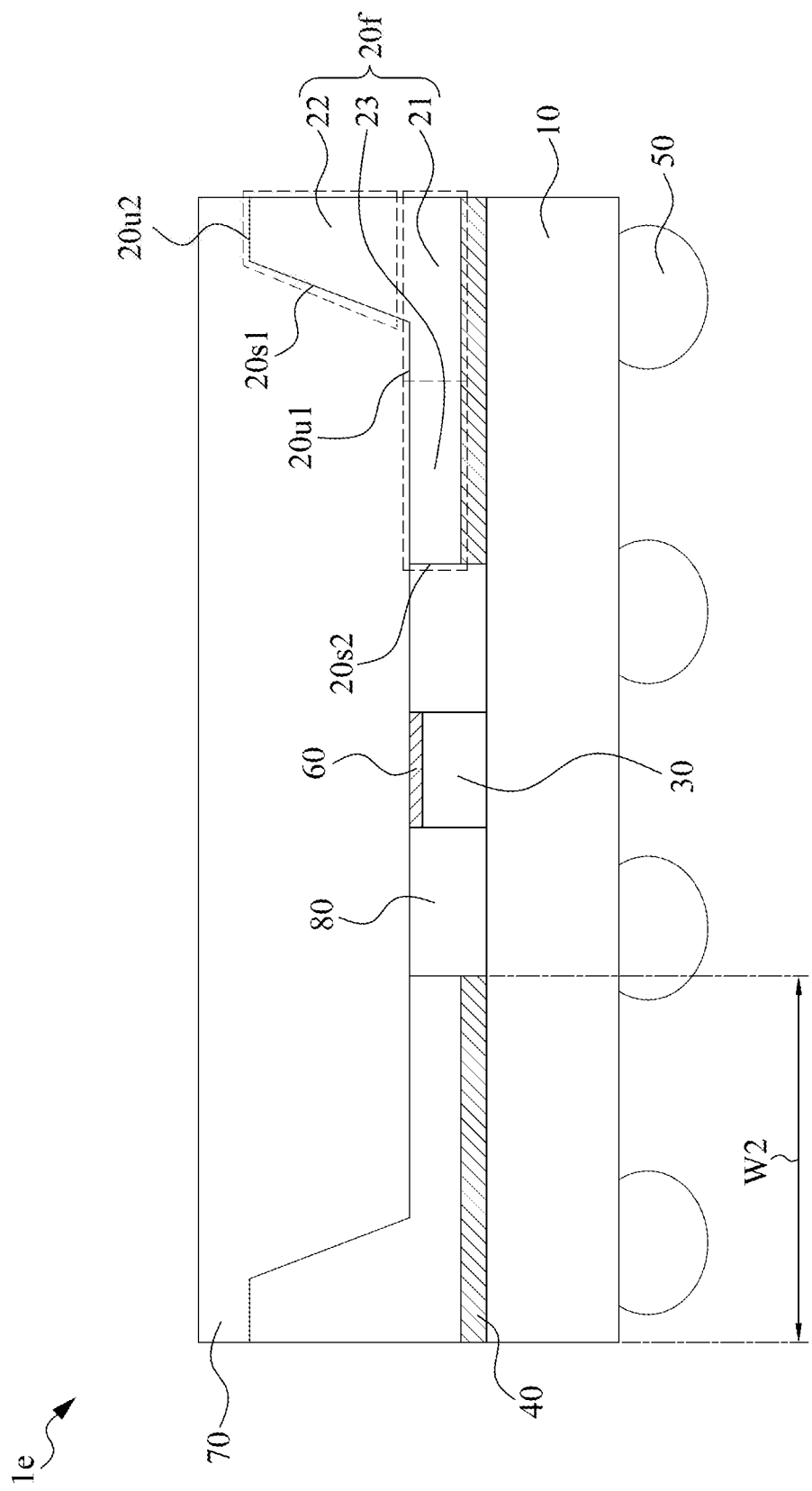
FIG. 10 illustrates a cross-sectional view of the semiconductor device structure along line C-C' of FIG. 8.

FIG. 10 illustrates a cross-sectional view of the semiconductor device structure 1e along line C-C'. The stiffener 20f may have the length W2 between two lateral surfaces of the stiffener 20f The length W2 may be measured along a lower surface of the stiffener 20f. In some embodiments, the third portion 23 may be disposed between the electronic component 30 and the first portion 21. In some embodiments, the upper surface 20u1 may be defined by the first portion 21 and the third portion 23. In some embodiments, the upper surface of the third portion 23 may be coplanar with that of the first portion 21. The heat dissipating element 70 may be in contact with the third portion 23.

In this embodiment, the space where no electronic component 30 is disposed can be used to dispose the third portion 23. Since there is greater contact area between the stiffener 20f and the heat dissipating element 70, the warpage of the substrate 10 may be further reduced. Moreover, heat can be much more easily dissipated by the stiffener 20f.

FIG. 11A, FIG. 11B, FIG. 11C, FIG. 11D and FIG. 11E illustrate one or more stages of an example of a method for manufacturing a semiconductor device structure 1a according to some embodiments of the present disclosure.

Figure 11A:
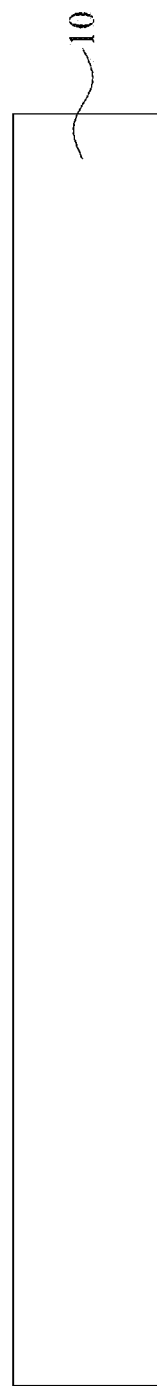
FIG. 11A illustrates one or more stages of an example of a method for manufacturing a semiconductor device structure according to some embodiments of the present disclosure.

Referring to FIG. 11A, a substrate 10 is provided. The substrate 10 may include a PCB or a lead frame.

Figure 11B:
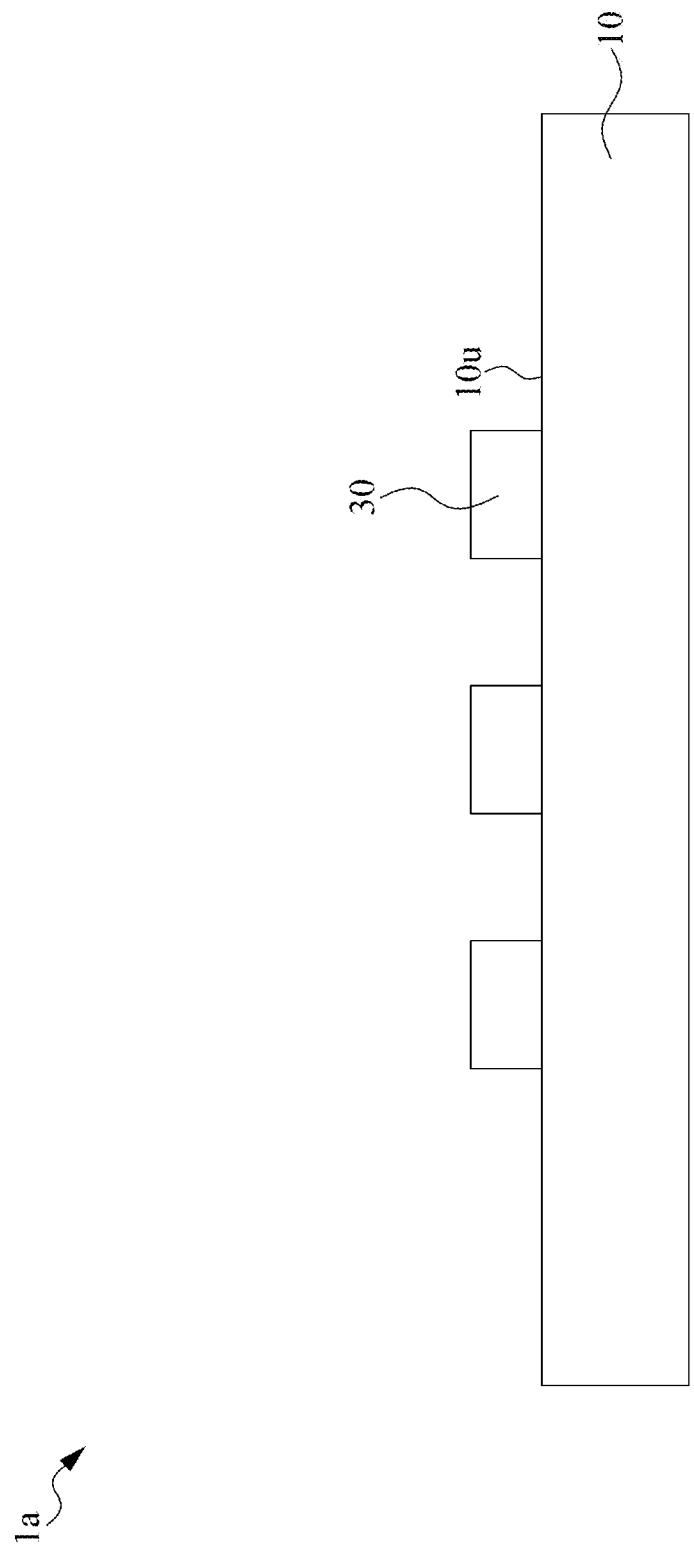
FIG. 11B illustrates one or more stages of an example of a method for manufacturing a semiconductor device structure according to some embodiments of the present disclosure.

Referring to FIG. 11B, one or more electronic components 30 may be disposed on the upper surface 10u of the substrate 10. In some embodiments, the electronic component 30 may electrically connect to the substrate 10.

Figure 11C:
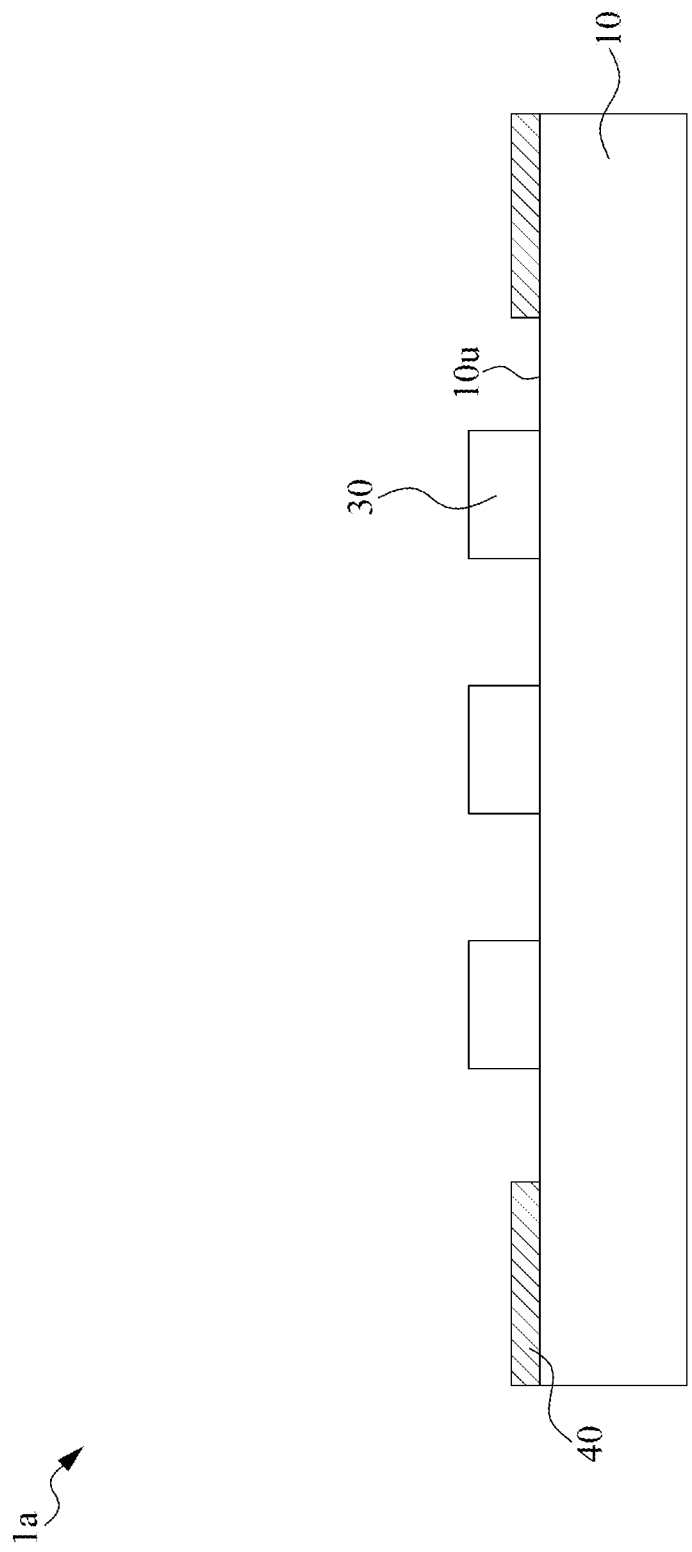
FIG. 11C illustrates one or more stages of an example of a method for manufacturing a semiconductor device structure according to some embodiments of the present disclosure.

Referring to FIG. 11C, an adhesive 40 may be coated on the upper surface 10u of the substrate 10.

Figure 11D:
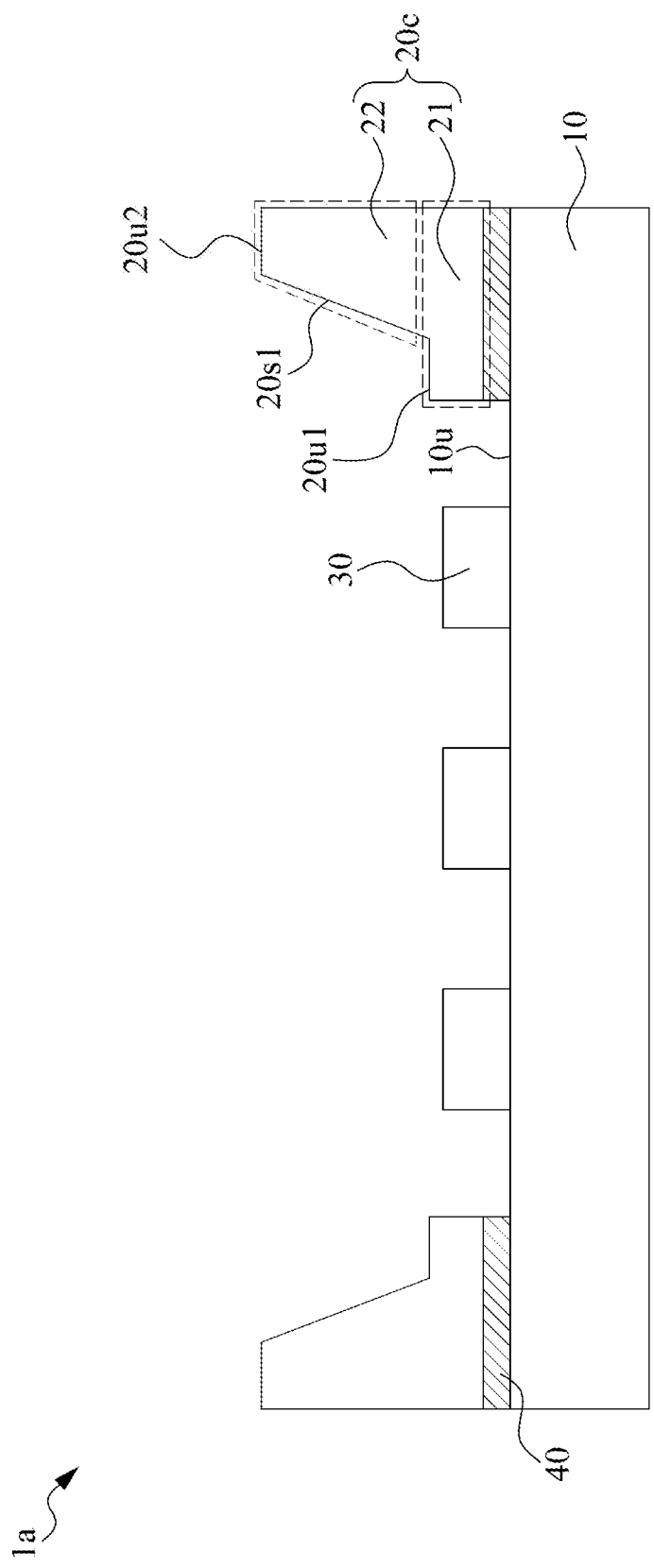
FIG. 11D illustrates one or more stages of an example of a method for manufacturing a semiconductor device structure according to some embodiments of the present disclosure.

Referring to FIG. 11D, a stiffener 20c, including a first portion 21 and a second portion 22, may be disposed on the upper surface 10u of the substrate 10 through the adhesive 40. The first portion 21 may be non-tapered. The second portion 22 may be tapered. The stiffener 20c may have an upper surface 20u1, an upper surface 20u2 and a lateral surface 20s1 extending from the upper surface 20u1 to the upper surface 20u2. The distance between the upper surface 20u1 of the stiffener 20c and the upper surface 10u of the substrate 10 is less than the distance between the upper surface 20u2 of the stiffener 20c and the upper surface 10u of the substrate 10.

In some embodiments, the first portion 21 and the second portion 22 may be formed in one-piece. In some embodiments, the first portion 21 and the second portion 22 may be formed separately. In this embodiment, the first portion 21 may be attached to the substrate 10, and then the second portion 22 may be attached to the first portion 21 through an adhesive. Alternatively, the first portion 21 and the second portion 22 may be integrated to form the stiffener 20c first, and then the whole stiffener 20c may be attached to the substrate 10.

In some embodiments, a heat dissipating element (not shown) may be disposed on the stiffener 20c and in contact with the stiffener 20c and the electronic components 30. Specifically, the heat dissipating element may be in contact with the upper surface 20u1, the lateral surface 20s1 and the upper surface 20u2 of the stiffener 20c, and the heat dissipating element may be in contact with an upper surface of the electronic component 30 via a TIM.

Figure 11E:
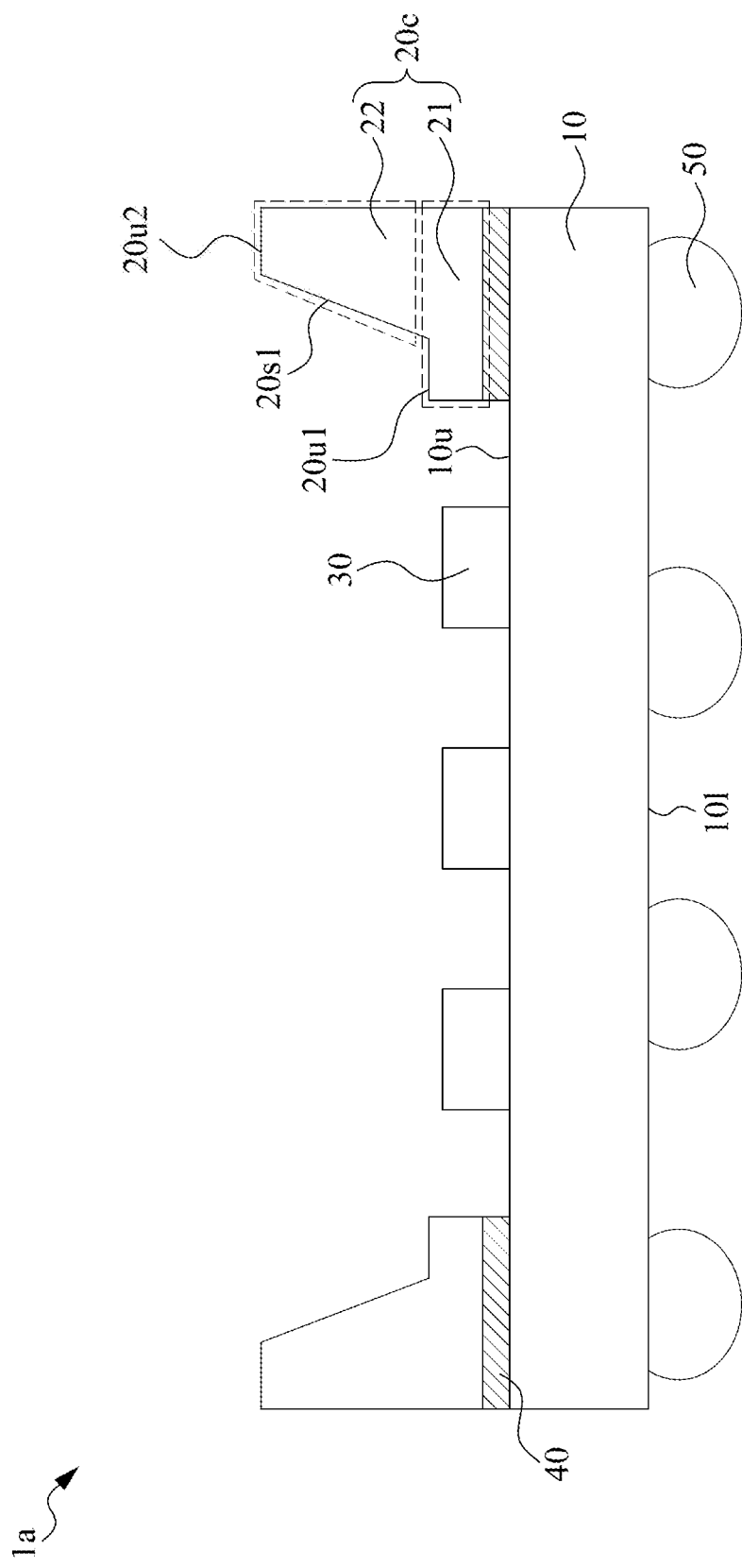
FIG. 11E illustrates one or more stages of an example of a method for manufacturing a semiconductor device structure according to some embodiments of the present disclosure.

Referring to FIG. 11E, multiple bumps 50 may be formed on the lower surface 101 of the substrate 10, and the semiconductor device structure 1a is produced.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device structure, comprising:
   a substrate having an upper surface;
   an electronic component disposed on the upper surface of the substrate;
   a stiffener disposed on the upper surface of the substrate and defining an accommodation space for accommodating the electronic component, wherein the stiffener comprises a first portion attached to the upper surface of the substrate, a second portion protruding upwards from the first portion and a third portion extending from the first portion toward the accommodation space and attached to the upper surface of the substrate, and the third portion is located beyond a vertical projection area of the second portion;
   a heat dissipating element disposed on the stiffener, wherein the third portion of the stiffener has a first supporting surface supporting the heat dissipating element, and a width of the third portion is greater than a width of the electronic component; and
   an adhesive layer, wherein the adhesive layer has a first portion and a second portion different from the first portion, and wherein the third portion of the stiffener is attached to the upper surface of the substrate by the first portion of the adhesive layer and not by the second portion of the adhesive layer, and a width of the first portion of the adhesive layer is greater than the width of the electronic component.

2. The semiconductor device structure of claim 1, wherein the first portion of the stiffener is attached to the substrate by the second portion of the adhesive layer, the second portion of the adhesive layer connects the first portion of the adhesive layer, and wherein a width of the second portion of the adhesive layer is greater than the width of the electronic component.

3. The semiconductor device structure of claim 1, wherein a horizontal projection area of the adhesive layer overlaps a lateral surface of the electronic component.

4. The semiconductor device structure of claim 1, further comprising:
   a filler located in the accommodation space and encapsulating the electronic component, wherein the filler includes a first portion disposed between a lateral surface of the electronic component and the third portion of the stiffener, and a width of the first portion of the filler is less than a width of the third portion of the stiffener.

5. The semiconductor device structure of claim 4, wherein the filler has a upper surface defining an opening exposing a upper surface of the electronic component, and wherein the heat dissipating element is disposed over the opening.

6. The semiconductor device structure of claim 1, the second portion of the stiffener has a second supporting surface higher than the first supporting surface and a slanted surface connecting the first supporting surface and the second supporting surface, and wherein the second supporting surface and the slanted surface support the heat dissipating element.

7. The semiconductor device structure of claim 6, wherein the first supporting surface is in contact with the heat dissipating element.

8. The semiconductor device structure of claim 7, wherein each of the slanted surface and the second supporting surface is in contact with the heat dissipating element.

* * * * *